(12) United States Patent
Johnston et al.

(10) Patent No.: US 7,605,469 B2
(45) Date of Patent: Oct. 20, 2009

(54) ATOMIC LAYER DEPOSITED TANTALUM CONTAINING ADHESION LAYER

(75) Inventors: Steven W. Johnston, Portland, OR (US); Kerry Spurgin, Portland, OR (US); Brennan L. Peterson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/883,357

(22) Filed: Jun. 30, 2004

(65) Prior Publication Data

US 2006/0003581 A1    Jan. 5, 2006

(51) Int. Cl.
*H01L 23/532* (2006.01)
*H01L 23/522* (2006.01)

(52) U.S. Cl. .............. 257/753; 257/761; 257/E23.145; 257/E23.155

(58) Field of Classification Search ............... 438/643, 438/644, 654, 653, 656, 648; 257/750, 751, 257/753, 761, 774, E23.145, E23.155
See application file for complete search history.

(56) References Cited

U.S. PATENT DOCUMENTS

| | | | | |
|---|---|---|---|---|
| 6,153,519 | A * | 11/2000 | Jain et al. | 438/681 |
| 6,204,204 | B1 * | 3/2001 | Paranjpe et al. | 438/785 |
| 6,229,211 | B1 * | 5/2001 | Kawanoue et al. | 257/751 |
| 6,627,995 | B2 * | 9/2003 | Paranjpe et al. | 257/750 |
| 6,706,626 | B2 | 3/2004 | Huang | |
| 6,794,284 | B2 * | 9/2004 | Vaartstra | 438/627 |
| 6,838,125 | B2 * | 1/2005 | Chung et al. | 427/562 |
| 6,846,516 | B2 * | 1/2005 | Yang et al. | 427/255.32 |
| 6,951,804 | B2 * | 10/2005 | Seutter et al. | 438/618 |
| 6,960,675 | B2 * | 11/2005 | Chen et al. | 556/42 |
| 6,972,267 | B2 * | 12/2005 | Cao et al. | 438/785 |
| 7,049,226 | B2 * | 5/2006 | Chung et al. | 438/648 |
| 7,071,562 | B2 * | 7/2006 | Ngo et al. | 257/762 |
| 7,081,271 | B2 * | 7/2006 | Chung et al. | 427/255.391 |
| 7,198,815 | B2 * | 4/2007 | Chen et al. | 427/69 |
| 7,276,441 | B1 * | 10/2007 | Cui et al. | 438/654 |
| 7,314,835 | B2 * | 1/2008 | Ishizaka et al. | 438/758 |

(Continued)

FOREIGN PATENT DOCUMENTS

CN    1134757    10/1996

(Continued)

OTHER PUBLICATIONS

Marika Juppo, "Atomic Layer Deposition of Metal and Transition Metal Nitride Thin Films and In Situ Mass Spectrometry Studies," Academic Dissertation, Presented Dec. 14, 2001 at the University of Helsinki, Finland, pp. 1-65, Retrieved from WWW on Jun. 30, 2004 at: <ethesis.helsinki.fi/julkaisut/mat/kemia/vk/juppo/atomicala.pdf>.

(Continued)

*Primary Examiner*—M. Wilczewski
(74) *Attorney, Agent, or Firm*—George Chen

(57) ABSTRACT

Apparatus and methods of fabricating an atomic layer deposited tantalum containing adhesion layer within at least one dielectric material in the formation of a metal, wherein the atomic layer deposition tantalum containing adhesion layer is sufficiently thin to minimize contact resistance and maximize the total cross-sectional area of metal, including but not limited to tungsten, within the contact.

6 Claims, 5 Drawing Sheets

U.S. PATENT DOCUMENTS

| | | | |
|---|---|---|---|
| 7,341,959 B2* | 3/2008 | Brcka | 438/758 |
| 7,371,878 B2* | 5/2008 | Chen et al. | 556/42 |
| 7,407,881 B2* | 8/2008 | Lee | 438/643 |
| 7,425,506 B1* | 9/2008 | Kailasam | 438/694 |
| 7,435,454 B2* | 10/2008 | Brcka | 427/569 |
| 7,446,032 B2* | 11/2008 | Kailasam | 438/625 |
| 7,482,286 B2* | 1/2009 | Misra et al. | 438/778 |
| 7,521,356 B2* | 4/2009 | Ramaswamy et al. | 438/627 |
| 2002/0058163 A1* | 5/2002 | Uzoh et al. | 428/698 |
| 2002/0106846 A1* | 8/2002 | Seutter et al. | 438/200 |
| 2003/0057526 A1* | 3/2003 | Chung et al. | 257/642 |
| 2003/0057527 A1* | 3/2003 | Chung et al. | 257/642 |
| 2003/0059538 A1* | 3/2003 | Chung et al. | 427/304 |
| 2003/0060042 A1 | 3/2003 | Park et al. | |
| 2003/0082301 A1* | 5/2003 | Chen et al. | 427/255.28 |
| 2003/0124262 A1* | 7/2003 | Chen et al. | 427/404 |
| 2003/0219979 A1 | 11/2003 | Choi et al. | |
| 2003/0224600 A1* | 12/2003 | Cao et al. | 438/684 |
| 2004/0048461 A1* | 3/2004 | Chen et al. | 438/629 |
| 2004/0077183 A1 | 4/2004 | Chung | |
| 2004/0187304 A1* | 9/2004 | Chen et al. | 29/830 |
| 2004/0219369 A1* | 11/2004 | Garg et al. | 428/446 |
| 2004/0234704 A1* | 11/2004 | Garg et al. | 427/569 |
| 2004/0241321 A1* | 12/2004 | Ganguli et al. | 427/255.28 |
| 2004/0262658 A1* | 12/2004 | Rasmussen | 257/300 |
| 2005/0009325 A1* | 1/2005 | Chung et al. | 438/637 |
| 2005/0037557 A1* | 2/2005 | Doczy et al. | 438/197 |
| 2005/0124154 A1* | 6/2005 | Park et al. | 438/643 |
| 2005/0272247 A1* | 12/2005 | Ikeda et al. | 438/618 |
| 2006/0006542 A1* | 1/2006 | Lee | 257/761 |
| 2006/0030148 A1* | 2/2006 | Seutter et al. | 438/653 |
| 2006/0084266 A1* | 4/2006 | Narushima et al. | 438/674 |
| 2006/0102895 A1* | 5/2006 | Hendrix et al. | 257/40 |
| 2006/0121307 A1* | 6/2006 | Matsuzawa et al. | 428/662 |
| 2006/0213437 A1* | 9/2006 | Ishizaka et al. | 118/715 |
| 2006/0225655 A1* | 10/2006 | Faguet et al. | 118/723 R |
| 2007/0042577 A1* | 2/2007 | Ishizaka | 438/503 |
| 2008/0102205 A1* | 5/2008 | Barry et al. | 427/250 |
| 2008/0299782 A9* | 12/2008 | Ramaswamy et al. | 438/785 |
| 2009/0043119 A1* | 2/2009 | Sekimoto et al. | 556/43 |
| 2009/0045514 A1* | 2/2009 | Ishizaka et al. | 257/751 |
| 2009/0163025 A1* | 6/2009 | Humayun et al. | 438/675 |

FOREIGN PATENT DOCUMENTS

| | | |
|---|---|---|
| WO | WO 03/038892 A2 | 5/2003 |
| WO | WO 03/038892 A3 | 5/2003 |

OTHER PUBLICATIONS

Jin-Seong Park et al., "Plasma-Enhanced Atomic Layer Deposition of Ta-N Thin Films", *Journal of the Electrochemical Society*, vol. 149, No. 1, 2002, pp. C28-C32.

* cited by examiner

ATOMIC LAYER DEPOSITED TANTALUM CONTAINING ADHESION LAYER

BACKGROUND OF THE INVENTION

1. Field of the Invention

An embodiment of the present invention relates to microelectronic device fabrication. In particular, an embodiment of the present invention relates to a tantalum containing adhesion layer for metal contacts deposited by atomic layer deposition to minimize contact resistance and maximize the low resistance conductive material within the contact.

2. State of the Art

The microelectronic device industry continues to see tremendous advances in technologies that permit increased integrated circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled microelectronic device packages. These transistors are generally connected to one another or to devices external to the microelectronic device by conductive traces and contacts through which electronic signals are sent and/or received.

One process used to form contacts is known as a "damascene process". In a typical damascene, a photoresist material is patterned on a dielectric material and the dielectric material is etched through the photoresist material patterning to form a hole extending to a source or drain of an underlying transistor. The photoresist material is then removed (typically by an oxygen plasma) and an adhesion layer may be deposit within the hole to prevent delimination between the dielelctric material and a subsequently deposited conductive material. The hole is then filled, usually by deposition, with the conductive material (e.g., such as metal and metal alloys thereof). For example, a 60-90 angstrom thick titanium nitride adhesion layer may be deposited in about a 70-80 nm diameter hole (65 nm technology node) by chemical vapor deposition followed by the filling of the remainder of the hole with tungsten. The adhesion layer may also prevent damage to the dielectric material during the deposition of the conductive material. For example, a titanium nitride adhesion layer prevents damage to the dielectric layer (such as silicon dioxide) by a tungsten hexafluoride gas used to deposit tungsten, as will be understood to those skilled in the art. The resulting structure is planarized, usually by a technique called chemical mechanical polish (CMP), which removes the conductive material and adhesion layer that is not within the hole from the surface of the dielectric material, to form the contact.

It is, of course, understood that since the adhesion layer has a higher electrical resistance than the conductive material, the conductive material must have a sufficient cross-sectional area within the contact to effectively conduct signals. However, as transistors become smaller with each successive technology node, the contact geometries decrease (i.e., "scale down"). Thus, a 60-90 angstrom thick adhesion layer, discussed above, will become problematical. For example, at the 45 nm technology node, the contact geometry (i.e., width) will be about 60 nm. Thus, a 90 angstrom thick adhesion layer will occupy about 30% of the contact width. As a further example, at the 30 nm technology node, the contact geometry will be about 40 nm. Thus, a 90 angstrom thick adhesion layer will occupy about 45% of the contact width. With both of these examples, it will be clear to those skilled in the art that the remaining contact width will likely not yield a cross-sectional area of the conductive material within the contact that will be sufficient to effectively conduct a reliable signal.

Therefore, it would be advantageous to develop apparatus and techniques to form an adhesion layer which will allow effective scaling down of contacts, as transistors become smaller with each successive technology node.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
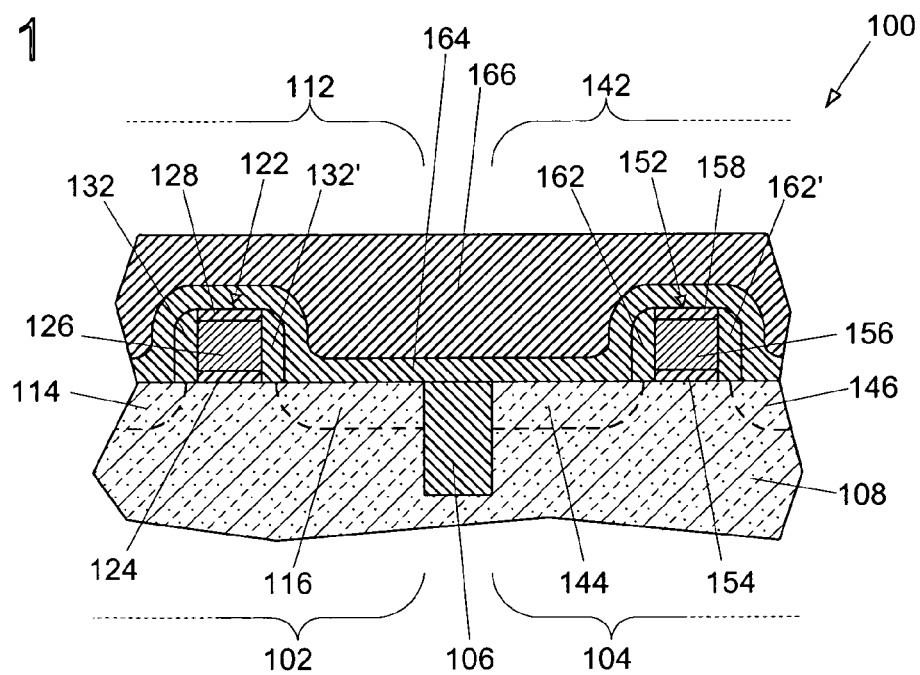
FIG. 1 is a side cross-sectional view of a portion of a multiple transistor assembly covered by at least on dielectric layer, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present inven- FIG. 1 illustrates a general transistor assembly 100 comprising a first active area 102 and a second active area 104 separated by an isolation structure 106, illustrated as a shallow trench isolation structure. The first active area 102 includes a first transistor 112 comprising a source region 114 and a drain region 116 implanted into a microelectronic substrate 108, such as a silicon wafer. A gate 122 is positioned between the first transistor source region 114 and the first transistor drain region 116. The first transistor gate 122 comprises a gate dielectric 124, a gate electrode 126, a gate cap 128, and gate spacers 132 and 132', as will be understood by those skilled in the art.

The second active area 104 includes a second transistor 142 comprising a source region 144 and a drain region 146 implanted into a microelectronic substrate 108. A gate 152 is positioned between the second transistor source region 144 and the second transistor drain region 146. The second transistor gate 152 comprises a gate dielectric 154, a gate electrode 156, a gate cap 158, and gate spacers 162 and 162', as will be understood by those skilled in the art.

A first dielectric layer 164, such as silicon dioxide, carbon doped oxide, and the like, is deposited over the first transistor gate 122, the first transistor source region 114, the first transistor drain region 116, the second transistor gate 142, the second transistor source region 144, and the second transistor drain region 146. A second dielectric layer 166, such as silicon dioxide, carbon doped oxide, and the like, may be deposited over the first dielectric layer 164.

Figure 2:
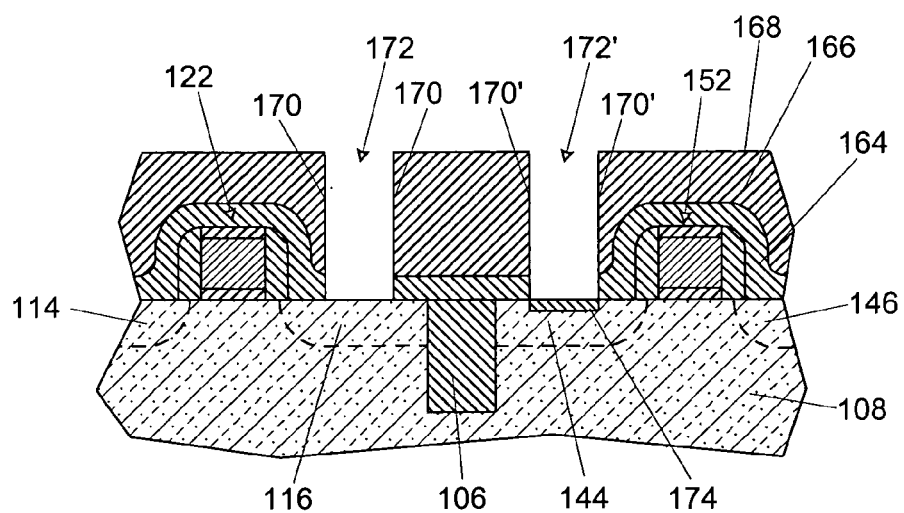
FIG. 2 is a side cross-sectional view of the transistor of FIG. 1, wherein openings extend through the dielectric layer to expose a portion of at least one transistor assembly such as a source and/or a drain, according to the present invention.

As shown in FIG. 2, at least one opening, illustrated as openings 172 and 172', is formed through the first dielectric layer 164 and the second dielectric layer 166, and defined by at least one side, shown as sides 170 and 170' of openings 172 and 172', respectively. The openings 172 and 172' extend from a first surface 168 of the second dielectric layer 166 to and exposing at least a portion of at least one of said source and drain regions, illustrated as extending to first drain region 116 and second transistor source region 144, respectively. The openings 172 and 172' may be formed by any method known in the art including, but not limited to, lithographic techniques and milling. A silicide layer 174 may be formed on at least one of the source regions or drain regions, illustrated on second transistor source region 144. The silicide layer 174 can be formed by the sputtering an appropriate metal, such as nickel, cobalt, titanium, platinum, and the like, and annealing at an appropriate temperature, such as between about 300° C. and 500° C.

Figure 3:
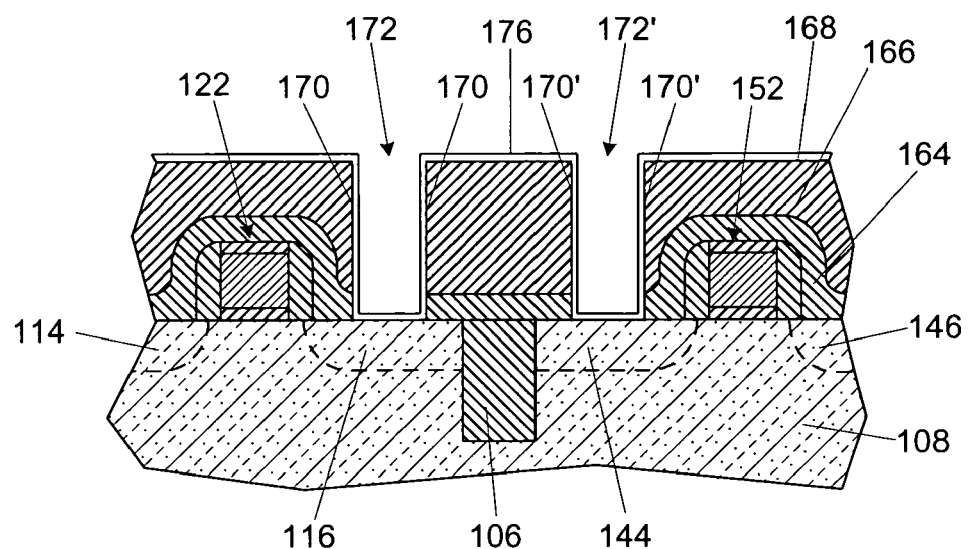
FIG. 3 is a side cross-sectional view of the transistor of FIG. 2, wherein an adhesion layer is deposited within the openings, according to the present invention.

As shown in FIG. 3, a tantalum containing adhesion layer 176 is formed over the second dielectric layer first surface 168, into at least one of opening(s) 172 and 172' by atomic layer deposition, and a portion of at least one of the source region and the drain region (illustrated as second source region 144 and first drain region 116). The tantalum containing adhesion layer 176 may include, but is not limited to, tantalum nitride, tantalum carbide, tantalum carbonitride, $TaC_xN_ySi_zO_w$ (wherein x, y, z, and w are less than 1), and the like. Atomic layer deposition is a surface controlled layer-by-layer process for the deposition of thin films with atomic layer accuracy. Each atomic layer formed in the sequential process may be a result of saturated surface controlled chemical reactions, wherein gasous precursors are introduced to the substrate and reacted with a reducing agent, wherein the system may be purged and the process repeated until a desire thickness is achieved. For a tantalum containing material deposition, metal precursors such as pentakis(dimethylamido)tantalum, tert-butylimidotris(diethylamido)tantalum, and the like may be used with a reducing agent of ammonia. Both pentakis(dimethylamido)tantalum and tert-butylimidotris(diethylamido)tantalum could also be reduced by hydrogen in a plasma enhanced atomic layer deposition or also by silane if silicon will desired in the resulting tantalum containing adhesion layer. A thermal enhanced atomic layer deposition of the tantalum containing adhesion layer 176 may be carried out using an inert carrier gas, such as argon or nitrogen, with a chamber at a pressure of between about 0.1 and 50 Torr, and at a temperature of between about 200° C. and 350° C. The thickness of the resulting tantalum containing adhesion layer 176 can be control to any desired thickness. In one embodiment, the thickness may be between about 5 angstroms and 25 angstroms on said opening sides 170 and 170'. The phrase "atomic layer deposition" or "atomic layer deposited" may be the thermal enhanced method described above or any technique of atomic layer deposition and may include plasma enhanced atomic layer deposition and ion enhanced atomic layer deposition.

Figure 4:
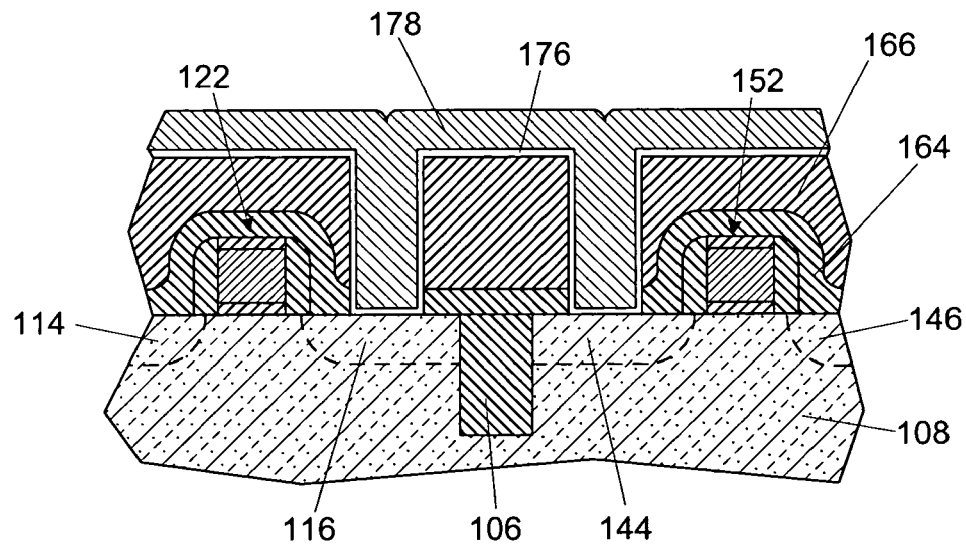
FIG. 4 is a side cross-sectional view of the transistor of FIG. 3, wherein a conductive material is disposed within the openings over adjacent the adhesion layer, according to the present invention.

As shown in FIG. 4, at least one conductive material 178, such as tungsten or copper (but not limited thereto), is deposited over the tantalum containing adhesion layer 176 and filling the openings 172 and 172' (illustrated in FIG. 2). The conductive material 178 can be deposited by any known method including but not limited to chemical vapor deposition, plasma enhanced chemical vapor deposition, physical deposition, and the like. For example, tungsten can be deposited in a chemical vapor deposition process using tungsten hexafluoride. In such a process the tantalum containing layer not only acts as an adhesion layer but also a barrier layer preventing the fluorine of the tungsten hexafluoride from reacting with the silicon within any dielectric layer or the microelectronic substrate 108. Thus, the conductive material 178 makes electrical contact with the source region 144 and the drain region 116.

Figure 5:
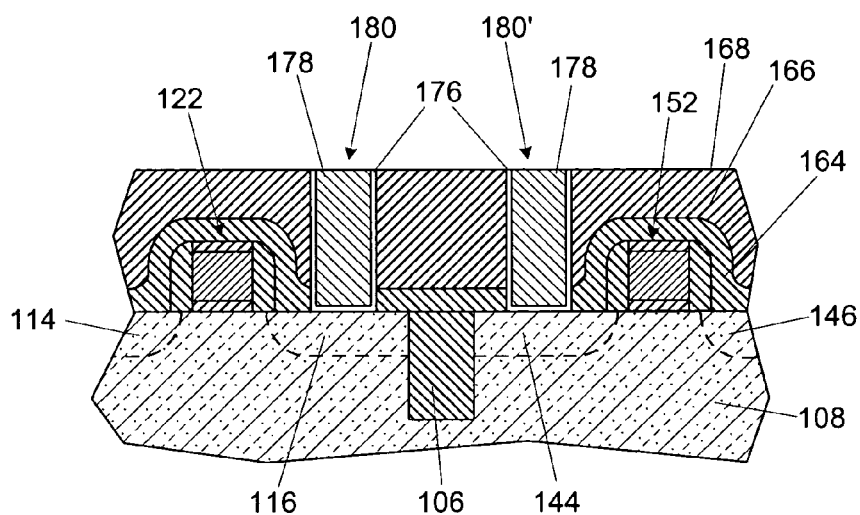
FIG. 5 is a side cross-sectional view of the transistor of FIG. 4, wherein the conductive material which in not disposed within the opening is removed, according to the present invention.

As shown in FIG. 5, a portion of the conductive material 178 and a portion of the tantalum containing adhesion layer 176 adjacent the second dielectric layer first surface 168 is removed, such as by chemical mechanical polishing, etching, or the like, thereby leaving the conductive material 178 and the tantalum containing adhesion layer 176 within the openings 172 and 172' (illustrated in FIG. 2) to form contacts 180 and 180', respectfully.

The described embodiment can result in a reduction in the resistivity of the overall contact by increasing the percent of the contact structure that is filled with the conductive metal. Furthermore, as the formation of the atomic layer disposed tantalum containing adhesion layer 176 and the deposition of the conductive material 178 can be carried out in a common chemical vapor deposition chamber, there is the ability to integrate the two processes into one tool to reduce process flow complexity and reduce overall fabrication processing costs for the contacts 180 and 180'.

Figure 6:
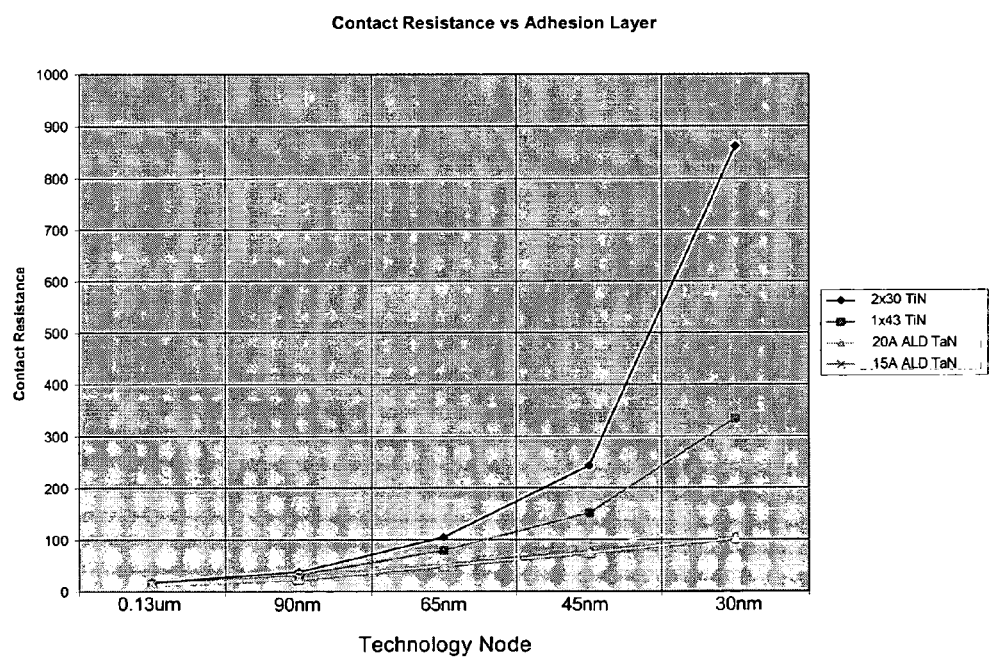
FIG. 6 is a chart of contact resistance versus adhesion layer thickness and type, according to the present invention.

It has been experimentally shown that a 10 angstrom atomic layer deposited tantalum containing layer can reduce the contact resistance of a 65 nm technology node copper contact by over 60% compared to an approximate 130 angstrom physical vapor deposited tantalum containing layer. The chemical composition of the tantalum containing layer may contain about 10% oxygen, about 25% carbon with the remainder tantalum and nitrogen (collectively "TaN" described below) FIG. 6 is a graph illustrating calculated estimations for contact resistance (ohm/sq), wherein "2×30 TiN" is 2 layers of 30 angstrom thick chemical vapor deposited titanium nitride, "1×43" is 1 layer of 43 angstrom thick chemical vapor deposited titanium nitride, "20 A ALD TaN" is 20 angstrom atomic layer deposited tantalum containing, and "15 A ALD TaN" is 15 angstrom atomic layer deposited tantalum containing. As it can be seen from the graph in FIG. 6, a 15 angstrom atomic layer deposited tantalum containing adhesion layer results in about a 76 ohm/sq contact resistance versus a 243 ohm/sq contact resistance for the 2×30 chemical vapor deposited titanium nitride adhesion layer at a 45 nm technology node, and in about a 103 ohm/sq contact resistance versus a 861 ohm/sq contact resistance for the 2×30 chemical vapor deposited titanium nitride adhesion layer at a 30 nm technology node. The calculation assumptions for the graph in FIG. 6 are: 0.13 μm technology node–300 nm height and 160 nm diameter contacts, 90 nm technology node–200 nm height and 110 nm diameter contacts, 65 nm technology node–110 nm height and 70 nm diameter contacts, 45 nm technology node–100 nm height and 50 nm diameter contacts, and 30 nm technology node–70 nm height and 35 m diameter contacts, all having tungsten conductive material with 20 μohm-cm resistivity.

Figure 7:
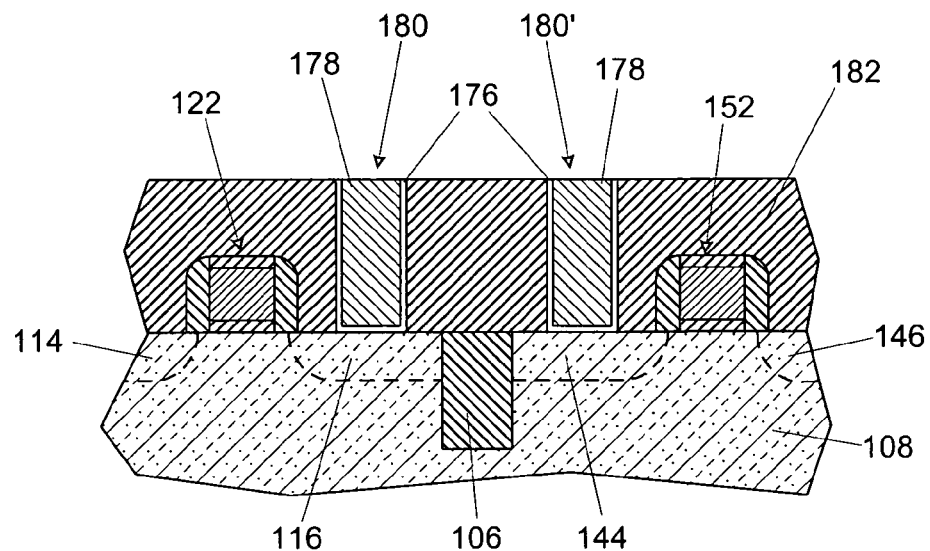
FIG. 7 is a side cross-sectional view of another embodiment, wherein the contacts are forming through a single dielectric layer, according to the present invention.
Figure 8:
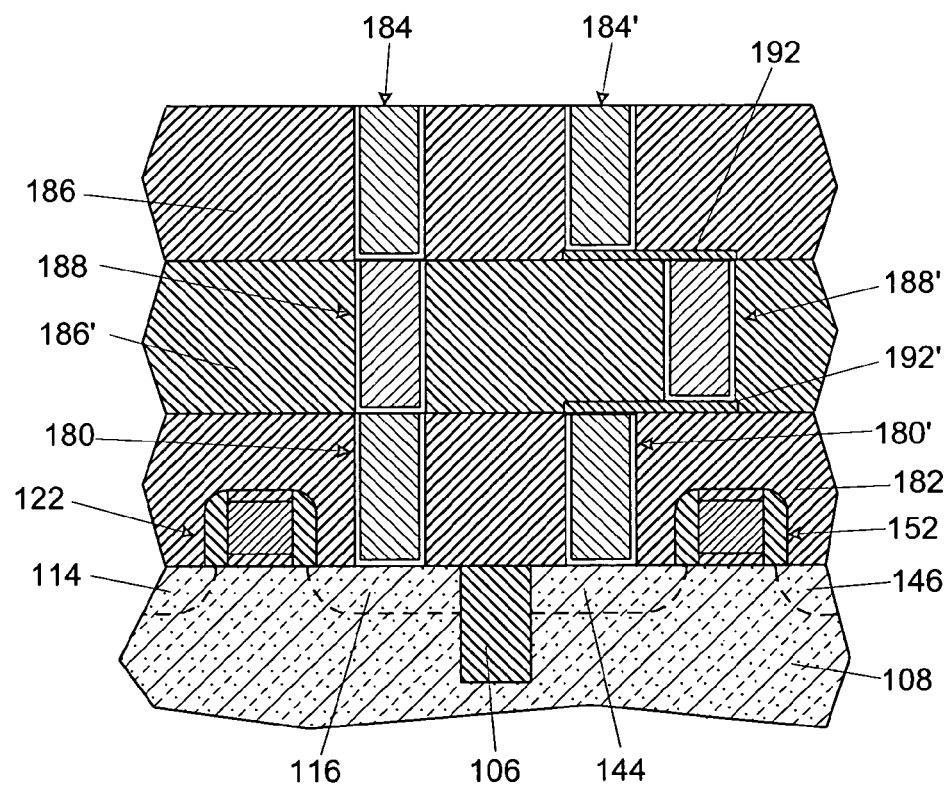
FIG. 8 is a side cross-sectional view of another embodiment, wherein the contacts are formed through interlayer dielectric layers, according to the present invention.

It is, of course, understood that the present invention can be practiced with a variety of structures and configurations, such as a through a single dielectric layer 182 as shown in FIG. 7. Furthermore, the present invention can be used, for example, to form contacts 184 and 184' through a first interlayer dielectric 186, which contact adjacent contacts 188 and 188' and/or traces 192 in or on a second interlayer dielectric 186', as will be understood by those skilled in the art, as shown in FIG. 8. A trace 192' is shown connecting second interlayer dielectric contact 188' and contact 180'.

Figure 9:
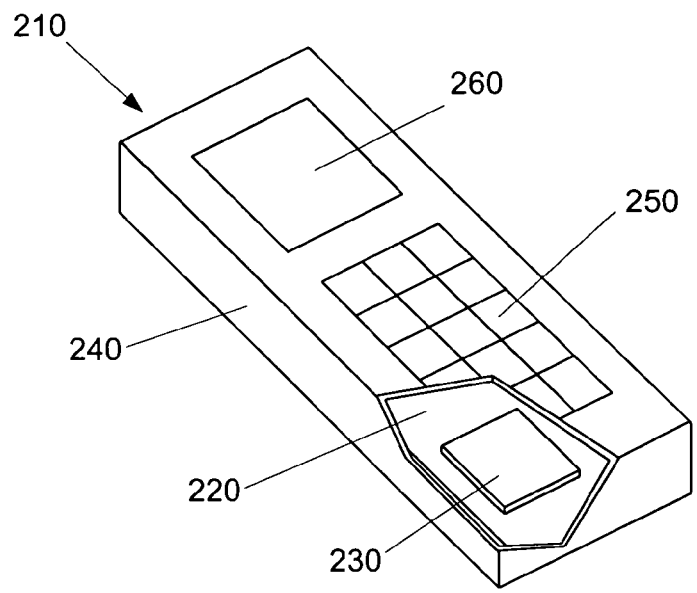
FIG. 9 is an oblique view of a hand-held device having a microelectronic assembly of the present integrated therein, according to the present invention.

The packages formed with the adhesion layer of the present invention may be used in a hand-held device 210, such as a cell phone or a personal data assistant (PDA), as shown in FIG. 9. The hand-held device 210 may comprise an external substrate 220 with at least one microelectronic device assembly 230, including but not limited to, a central processing units (CPUs), chipsets, memory devices, ASICs, and the like, having at least one atomic layer deposited tantalum containing adhesion layer as described above, within a housing 240. The external substrate 220 may be attached to various peripheral devices including an input device, such as keypad 250, and a display device, such an LCD display 260.

Figure 10:
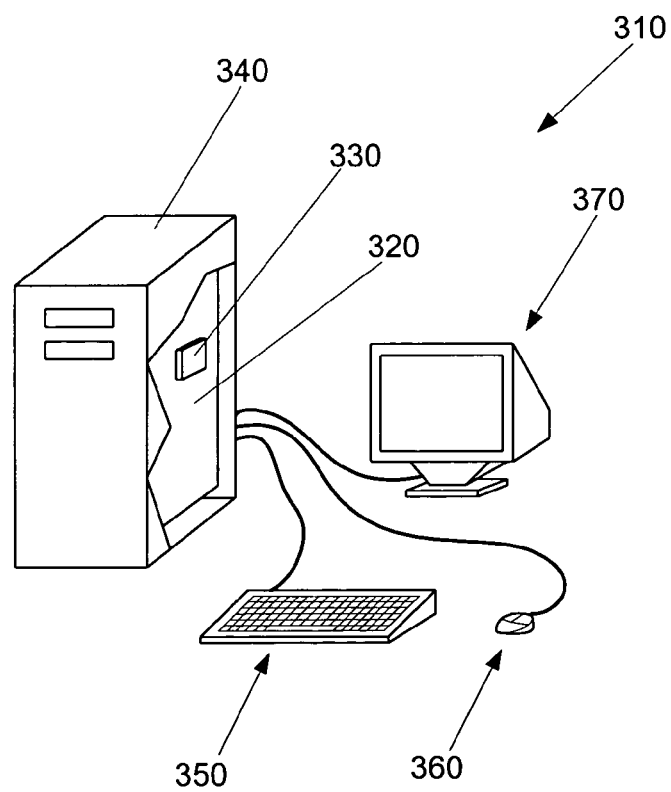
FIG. 10 is an oblique view of a computer system having a microelectronic assembly of the present integrated therein, according to the present invention.

The microelectronic device assemblies formed with the adhesion layer of the present invention may also be used in a computer system 310, as shown in FIG. 10. The computer system 310 may comprise an external substrate or motherboard 320 with at least one microelectronic device assembly 330, including but not limited to, a central processing units (CPUs), chipsets, memory devices, ASICs, and the like, having at least one atomic layer deposited tantalum containing adhesion layer as described above, within a housing or chassis 340. The external substrate or motherboard 320 may be attached to various peripheral devices including inputs devices, such as a keyboard 350 and/or a mouse 360, and a display device, such as a CRT monitor 370.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   a conductive material extending through at least one dielectric layer; and
   a tantalum containing adhesion layer between said conductive material and said at least one dielectric layer, wherein said tantalum containing adhesion layer comprises about 10% oxygen, about 25% carbon, with the remainder tantalum and nitrogen.

2. An apparatus formed by a method comprising:
   providing at least one dielectric layer;
   forming at least one opening extending through said at least one dielectric layer, wherein said opening is defined by at least one side;
   atomic layer depositing a tantalum containing adhesion layer on said at least one side, wherein said tantalum containing adhesion layer comprises about 10% oxygen, about 25% carbon, with the remainder tantalum and nitrogen; and
   depositing at least one conductive material to fill said opening and abut said tantalum containing adhesion layer.

3. An electronic system comprising:
   an external substrate within a housing;
   at least one microelectronic device package attached to said external substrate, having at least one contact including:
      a conductive material extending through at least one dielectric layer; and
      a tantalum containing adhesion layer between said conductive material and said at least one dielectric layer, wherein said tantalum containing adhesion layer comprises about 10% oxygen, about 25% carbon, with the remainder tantalum and nitrogen;
   an input device interfaced with said external substrate; and
   a display device interfaced with said external substrate.

4. An apparatus, comprising:
   a conductive material extending through at least one dielectric layer; and
   a tantalum containing adhesion layer between said conductive material and said at least one dielectric layer, said tantalum containing adhesion layer comprising about 10% oxygen, about 25% carbon, with the remainder tantalum and nitrogen, formed from a metal precursor containing tantalum and carbon reduced by silane in a carrier gas of nitrogen.

5. An apparatus formed by a method comprising:
   providing at least one dielectric layer;
   forming at least one opening extending through said at least one dielectric layer, wherein said opening is defined by at least one side;
   atomic layer depositing a tantalum containing adhesion layer on said at least one side with a metal precursor containing tantalum and carbon reduced by silane in a carrier gas of nitrogen, said tantalum containing adhesion layer comprising about 10% oxygen, about 25% carbon, with the remainder tantalum and nitrogen; and
   depositing at least one conductive material to fill said opening and abut said tantalum containing adhesion layer.

6. An electronic system comprising:
an external substrate within a housing;
at least one microelectronic device package attached to said external substrate, having at least one contact including:
- a conductive material extending through at least one dielectric layer; and
- a tantalum containing adhesion layer between said conductive material and said at least one dielectric layer, said tantalum containing adhesion layer comprising about 10% oxygen, about 25% carbon, with the remainder tantalum and nitrogen, formed from a metal precursor containing tantalum and carbon reduced by silane in a carrier gas of nitrogen;

an input device interfaced with said external substrate; and
a display device interfaced with said external substrate.

* * * * *

UNITED STATES PATENT AND TRADEMARK OFFICE
CERTIFICATE OF CORRECTION

| | | |
|---|---|---|
| PATENT NO. | : 7,605,469 B2 | Page 1 of 1 |
| APPLICATION NO. | : 10/883357 | |
| DATED | : October 20, 2009 | |
| INVENTOR(S) | : Johnston et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 43 days.

Signed and Sealed this

Fifth Day of October, 2010

David J. Kappos
*Director of the United States Patent and Trademark Office*